United States Patent
Mielke et al.

(10) Patent No.: US 6,195,772 B1
(45) Date of Patent: *Feb. 27, 2001

(54) ELECTRONIC CIRCUIT TESTING METHODS AND APPARATUS

(75) Inventors: Bruce F. Mielke, Los Altos Hills; Matthew C. Hendricks, Palo Alto; Howard Marshall; Richard Swan, both of Portola Valley; Lee R. Althouse, Santa Clara; Ken A. Ito, San Jose, all of CA (US)

(73) Assignee: Altera Corporaiton, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/850,790

(22) Filed: May 2, 1997

Related U.S. Application Data

(60) Provisional application No. 60/020,168, filed on Jun. 21, 1996.

(51) Int. Cl.[7] .............................. G01R 31/28; G01R 31/02
(52) U.S. Cl. ...................... 714/724; 714/725; 714/736; 714/742; 714/744; 714/815; 324/73.1
(58) Field of Search ...................................... 714/744, 724, 714/725, 733, 734, 735, 736, 738, 815, 742; 324/73.1

(56) References Cited

U.S. PATENT DOCUMENTS

| | | | |
|---|---|---|---|
| 4,450,560 | 5/1984 | Conner | 714/736 |
| 4,517,512 | 5/1985 | Petrich et al. | 714/724 |
| 4,517,661 | 5/1985 | Graf et al. | 714/900 |
| 4,806,852 | * 2/1989 | Swan et al. | 324/73.1 |
| 4,965,799 | * 10/1990 | Green et al. | 714/719 |
| 5,164,665 | 11/1992 | Yamashita et al. | 714/744 |
| 5,177,630 | * 1/1993 | Goutzoulis et al. | 359/135 |
| 5,268,639 | * 12/1993 | Gasbarro et al. | 714/736 |
| 5,524,114 | * 6/1996 | Peng | 714/724 |

* cited by examiner

*Primary Examiner*—Emmanuel L. Moise
(74) *Attorney, Agent, or Firm*—Fish & Neave; Robert R. Jackson; Michael E. Shanahan

(57) ABSTRACT

An electronic circuit tester (e.g., for testing integrated circuit wafers or packaged integrated circuits) is provided. The tester is preferably based on a relatively inexpensive computer system such as a personal computer and includes at least one high-precision clock circuit that is programmable with respect to frequency and number of clock pulses. The high-precision clock circuit is connectable to the circuit being tested to permit certain timing-critical tests to be performed, even though a large number of other data channels in the tester are controlled by a relatively low speed clock circuit. The tester also includes analog circuitry that can be programmed to provide various analog signals suitable for performing parametric testing on an electronic device under test.

69 Claims, 4 Drawing Sheets

ELECTRONIC CIRCUIT TESTING METHODS AND APPARATUS

This application claims the benefit of U.S. provisional application No. 60/020,168, filed Jun. 21, 1996, which is hereby incorporated by reference herein.

BACKGROUND OF THE INVENTION

This invention relates to electronic circuit testing methods and apparatus, and more particularly to lowering the cost of such methods and apparatus while still maintaining a high degree of test capability.

Electronic circuit testers are well known in the art and are frequently designed to be general-purpose devices. This often means that each channel of the tester has the capability to provide very precise signals with very precise timing. For example, signal timing may be controllable to 0.1 nanosecond in each tester channel. Because of the complexity of the circuitry required to produce such precisely controlled testing, each channel of prior art testers may cost from $3000 to $6000. Modern integrated circuits may have hundreds of terminals (pins) to which signals must be applied and/or from which signals must be output in order to test the circuit. Because each terminal of the circuit being tested typically requires a separate tester channel, it is not uncommon for testers to cost hundreds of thousands of dollars, or even in excess of a million dollars.

The complexity of the channel circuitry of many prior electronic circuit testers also means that their overall control circuitry must be relatively complex. For example, extremely high speed test vector memories may be needed to supply successive test vectors at the rate required to keep up with desired test speeds. Whereas for reasons of economy it might be desirable to use a computer of the relatively low cost personal computer class to control an electronic circuit tester, this has often not been possible because the demands of prior testers for extremely high speed and high precision have exceeded the capabilities of personal computers for control.

In view of the foregoing it is an object of this invention to provide highly capable electronic circuit testers which have much lower cost than many prior testers.

It is a more particular object of this invention to provide electronic circuit testers which lend themselves to operation by computers of the personal computer class.

SUMMARY OF THE INVENTION

These and other objects of the invention are accomplished in accordance with the principles of the invention by providing electronic circuit tester apparatus which includes a programmable computer and programmable interface circuitry operably connected between the computer and the electronic circuit to be tested. The computer is preferably of the personal computer class. The interface circuitry preferably includes programmable logic circuits (such as programmable logic array integrated circuit devices) which can be programmed by the computer in order to implement various tester architectures. The computer has a memory for storing (1) tester architecture data for use in programming the interface circuitry to the desired tester architecture, (2) control data for controlling certain basic conditions of tests (e.g., power supply voltages, parametric signal values, etc.), and (3) test vector data indicative of input data signals to be applied to terminals of the circuit to be tested and output data signals expected from that circuit in response to those input signals. At least some of the communication between the computer and the interface circuitry is via a bus (such as a conventional personal computer Peripheral Component Interface (PCI) bus) which provides a clock signal (e.g., a PCI clock signal). The above-mentioned control data may include data indicating how many of these PCI clock signal cycles the interface circuitry should allow between applying input data signals to the circuit to be tested and looking for the output data signals that should result from those input signals.

The interface circuitry may also include a programmable clock signal generating circuit. The clock signal circuit is preferably a high quality circuit that is programmable with regard to clock speed and number of pulses, and is capable of very precise, high speed operation. The programming for this high speed clock signal circuit may come from the computer (e.g., as part of the above-mentioned control data). The high speed clock signal can be applied to various terminals (e.g., a clock input terminal) of the circuit to be tested to test more speed-critical features of the circuit. For example, a high speed clock signal produced by the clock signal circuit may be used to test counter speed or register to register delay in the circuit to be tested.

The interface circuitry may receive successive test vectors under control of the computer, or the interface circuitry may operate in a direct memory access (DMA) mode to retrieve successive test vectors from the computer memory without intervention of the computer processor. This may allow the interface circuitry to receive test vectors faster than would be possible under computer processor control. The interface circuitry may also be programmable to itself generate a succession of test conditions without the need for every test condition to be specified in full by a separate test vector from the computer memory.

The interface circuitry may be programmable to compare actual and expected outputs from the circuit to be tested, and to store the results of such comparisons. Thereafter, the computer may interrogate the interface circuitry to retrieve those results.

The interface circuitry also preferably includes programmable circuitry for applying various analog signal characteristics to the circuit to be tested, and for monitoring analog responses of the latter circuit to those applied characteristics. For example, this analog circuitry may be programmable to apply various voltages to the circuit to be tested, and to detect the amount of current that flows in response to that voltage.

Most of the channels of the tester circuitry of this invention can be of relatively low cost construction because the primary purpose of these channels is to test logic-type operation of the circuit being tested. Only the programmable clock circuit and to a lesser extent the programmable analog test circuitry need to be of higher cost construction associated with extreme precision and high speed operation. For testers with a large number of channels, the overall cost of a tester constructed in accordance with this invention can be considerably lower than for a conventional tester requiring extreme precision and high speed operation in every channel.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
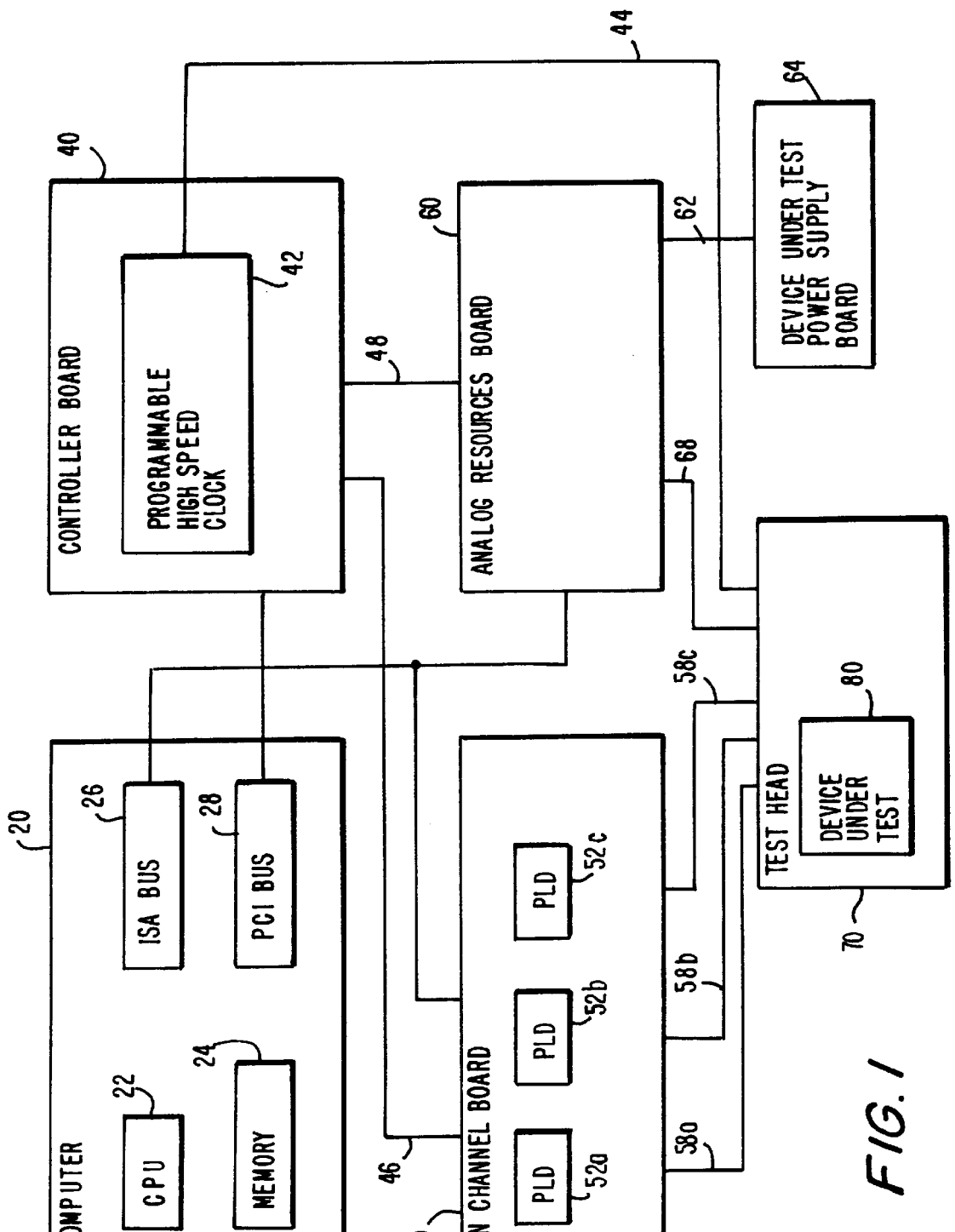
FIG. 1 is a simplified block diagram of an illustrative embodiment of circuit tester apparatus constructed in accordance with this invention.

In the illustrative embodiment shown in FIG. 1, circuit tester 10 includes a programmable computer 20, which may be a conventional personal computer equipped with a central processing unit (CPU or processor) 22, a memory 24, an Industry Standard Architecture (ISA) bus 26 (i.e., an IBM-standard, 16 bit, 8 MHZ bus), and a Peripheral Component Interface (PCI) bus 28 (i.e., an Intel-standard, 32 bit, 33 MHZ bus). All of the components of computer 20 may be conventional, and they may be conventionally interconnected by interconnections that are not shown in detail in FIG. 1. It should be noted that PCI bus 28 conventionally includes a 33 MHZ clock for producing a 33 MHZ PCI clock signal on the PCI bus.

Controller board 40 is connected to computer 20 via PCI bus 28. Pin channel board 50 and analog resources board 60 are connected to computer 20 via ISA bus 26. Board 40 includes a programmable high speed clock circuit 42. Board 60 is supported by device under test power supply board 64. Boards 40 and 50 are interconnected by leads 46. Boards 40 and 60 are interconnected by leads 48. Boards 60 and 64 are interconnected by leads 62.

The circuit 80 to be tested (e.g., an integrated circuit wafer or a packaged integrated circuit device) is placed in a test head 70 which connects the terminals of circuit 80 out to more conveniently accessible terminals of the test head. (Because test head 70 is primarily a passive conduit between device 80 and the test apparatus, it is generally sufficient in this discussion to omit references to test head 70 and to refer only to the terminals of device 80.) Test head 70 is connected to pin channel board 50 via several groups of leads 58a, 58b, and 58c. Test head 70 is also connected to controller board 40 via lead 44 and to analog resources board 60 via leads 68. Leads 46, 48, 58, 62, and 68 may be ribbon cables. Lead 44 is preferably a coaxial cable. There may be several pin channel boards 50 connected in parallel with one another between components 20, 40, and 60, on the one hand, and test head 70, on the other hand. This invention will be fully understood, however, from this description which generally assumes the presence of only one board 50. Test head 70 may be constructed to support any number of channels. Examples are test heads for supporting 256 channels or up to 768 channels.

Controller board 40 includes a PCI bus interface which serves boards 40 and 50. All communication between computer 20 and pin channel board 50 is via PCI bus 28, the PCI bus interface in board 40, and leads 46. Board 50 only uses its ISA bus connection to computer 20 as its power and ground signal supplies. Analog resources board 60, on the other hand, actually communicates with computer 20 via ISA bus 26. Leads 48 are for connection of "parametric" test signals (e.g., programmably selectable and precisely controlled voltages and/or currents) produced by board 60 to board 40, and thence to device 80 via leads 46, board 50, leads 58, and test head 70.

Device under test power supply board 64 is controlled from analog resources board 60 via leads 62 and is the power supply for device 80. Board 64 receives a programmable voltage reference signal and produces adequate power at that voltage. Board 64 may also sense how much current device 80 is drawing at that voltage. In addition to the foregoing functions, board 64 provides a regulated voltage supply for the whole system to the extent that voltages above 12 volts are needed. The power supply signals for device 80 flow to that device from board 64 via leads 62, board 60, and leads 68. Board 64 contains a DC—DC converter to supply the rest of the tester with +20V. Board 64 also contains the voltage regulators which supply VCC1 and VCC2 current. Two such VCC signals are provided because some devices 80 to be tested have two VCC inputs (e.g., one for input/output circuitry, and one for core logic circuitry). If a device 80 to be tested requires only one VCC signal, either VCC1 or VCC2 can be used for that signal. Leads 62 carry VCC reference voltages from digital to analog converters on analog resources board 60, ICC current sense voltages to be read on board 60, and high current (up to 3.0 amps) VCC outputs which are routed through board 60 to test head 70.

As has already been partly described, analog resources board 60 is controllable by computer 20 to produce parametric signals for testing device 80. For example, board 60 may produce a precise voltage for application to device 80 so that the current that flows in response to that voltage can be measured. Alternatively, board 60 may produce a precise current for application to device 80 so that the voltage that results from that current flow can be measured. Board 60 also controls board 64 to produce the desired power supply voltage for device 80. Board 60 includes one or more digital to analog converters for receiving digital voltage requests from computer 20 and converting those digital requests to the appropriate analog values. Thus board 60 includes a parametric measurement unit (PMU), VHH drivers and programmable supplies for programming devices 80 that are based on EPROM and EEPROM technology, and programmable VCC power supply related circuitry. Board 60 is accessed on ISA bus 26 as a series of 16 and 8 bit port addresses. Board 60 is connected via ribbon cable 68 to test head 70, via ribbon cable 62 to device under test power supply board 64, and via ribbon cable 48 to controller board 40.

Pin channel board 50 is controllable by computer 20 (via the above-mentioned PCI bus interface in controller board 40) to generate the digital data that is applied to device 80 and to receive back the data output by device 80 in response to the applied data. Board 50 is controllable by computer 20 (again via the PCI bus interface in controller board 40) to compare the actual digital data received back to the digital data that should be received back if device 80 is operating properly. On the basis of such comparisons, board 50 can respond to interrogation by computer 20 by indicating whether or not device 80 is operating properly. PLDs 52 (e.g., FLEX 10K reprogrammable logic devices available from Altera Corporation of San Jose, Calif.) are programmable by computer 20 to perform the foregoing functions. (As an alternative to board 50 comparing actual and expected device 80 outputs, the actual outputs can be communicated back to computer 20, which then compares those actual outputs to the expected outputs in order to assess the performance of device 80.) Board 50 also applies the parametric signals from board 60 to desired terminals of device 80, and board 50 receives the responses to those stimuli. In particular, each digital channel on board 50 includes circuitry to allow connection of the PMU on analog resources board 60 to an associated pin of device 80 in order to perform parametric tests such as opens, shorts, and leakage. Computer 20 analyzes the parametric test signals in order to perform these parametric tests.

As has been mentioned, controller board 40 includes programmable high speed clock 42. Clock 42 is controllable by instruction data from computer 20 to produce any desired number of clock signal pulses (within a permitted range for such a number of pulses) at any desired frequency (within a permitted frequency range). It has also been mentioned that board 40 includes a PCI bus interface. And board 40 includes circuitry for controlling various aspects of test sequences and timing (under programmable control from computer 20). For example, board 40 controls when to drive device 80 with test signals, when to apply a clock pulse or clock pulse sequence to device 80 (i.e., the low speed control aspects of high speed clock 42), and when to strobe device 80 for outputs.

Among the data stored in memory 24 is data for (1) programming PLDs 52 to set the apparatus up with a desired tester architecture, (2) test vectors which specify the test data to be applied to device 80 and the output data expected from that device in response to the applied data, and (3) the test program itself. For example, the first type of data mentioned above may program PLDs 52 on pin channel board 50 to optimize the tester to test different types of devices 80 such as programmable logic devices (PLDs), random access memories (RAMs), etc. Such programming makes the tester into a particular type of machine and typically needs to be changed only infrequently (e.g., when significantly different types of devices 80 are to be tested). The third type of data mentioned above controls the tester for the particular device to be tested. For example, this data controls certain relatively general conditions of the test such as the power supply voltages to be applied to device 80, parameters for the operation of high speed clock 42, parametric test signal values, and the manner in which PCI clock signal pulses will be used to time (1) the application of test vector data or high speed clock signals to device 80 and (2) the strobing of device 80 for output data. Any pin of device 80 may be clocked with a signal based on the PCI clock signal, and the program data may select the pin to receive such a signal.

Exemplary test vector data (the second type of data from memory 24 as mentioned above) specifies the logic levels of test signals to be applied to particular terminals of device 80 (bearing in mind that terminal assignments are programmable as a result of the programming of PLDs 52). The test vector data also specifies the logic levels of the expected responses of device 80 to the test signals mentioned in the preceding sentence. For the most part, test vector data flows from computer 20 to device 80 via PCI bus 28, controller board 40, leads 40, programmed PLDs 52, and leads 58. As has been mentioned, the test program data (the third type of data mentioned earlier, and also sometimes called control data) may control when (in the PCI clock pulse train) test vector data is applied to device 80 and how many PCI clock pulses thereafter device 80 will be strobed for output data. After device 80 has been strobed, board 50 (in particular PLDs 52) compares the logic levels of specified device 80 output signals to the expected logic levels for those signals. PLDs 52 store data indicative of the results of these comparisons. Computer 20 retrieves this data to determine whether or not device 80 is performing as desired.

It should be noted that the basic tests described above can be performed on any of a very large number of device 80 terminals. Board 50 preferably has a large number of channels (one channel for each device 80 terminal that can be tested as described above) to permit the testing of a large number of device terminals. However, these basic tests are logic or function tests. The timing for the signals in these channels is produced en masse by board 40 (e.g., from the PCI clock signal). Thus the channels provided by board 50 can each be relatively inexpensive because these channels do not include high precision, individual, signal level and/or timing control, which would greatly increase their cost. The relatively low cost of the channels on board 50 contributes in a major way to reducing the overall cost of the testers of this invention.

Although most of the channels of the testers of this invention do not have high resolution or exceptionally precise timing control, many precise timing tests can be performed on a device 80 by making use of programmable high speed clock 42. As has been mentioned, clock 42 is programmable to produce a defined burst of a selected number of pulses, the frequency or time period of which is also selectable. This capability may be used, for example, to measure the speed of various devices 80. Such speed measurement allows devices 80 to be sorted according to speed so that the faster devices can be identified and sold for a higher price than the slower devices.

An example of using high speed clock 42 to measure device speed includes test data to set device 80 up as a counter. (In this example, device 80 is assumed to be a reprogrammable logic array integrated circuit device such as an Altera FLEX 10K PLD of the general type mentioned above. Some of the test data from computer 20 is used to program device 80 to perform a desired logic function (in this case a counter function).) Further test data selects a speed and number of pulses for clock 42. Clock 42 is then enabled to produce that number of pulses at that speed, and device 80 attempts to count those pulses. After clock 42 has completed its operation, the counter output terminals of device 80 are strobed (read out) under test vector control to board 50. Board 50 (or computer 20) compares the count registered by device 80 to the number of pulses produced by clock 42. If the count is accurate, device 80 is at least as fast as the clock speed. If the count is not accurate, device 80 is not as fast as the clock speed. If the count is initially accurate, the high speed clock test may be repeated with gradually increasing clock speed until device 80 no longer counts accurately. The last accurate test determines the maximum speed of the device. If the count is not initially accurate, the high speed clock test may be repeated with gradually decreasing clock speed until device 80 begins to count accurately. The first accurate test determines the maximum speed of the device.

As an alternative gradually increasing or decreasing clock speed in the above-described example, a so-called binary test sequence may be used. The range between the maximum and minimum possible clock speeds of the device under test is divided in half and a first test is conducted with a clock speed at that midpoint of the possible speed range. If the first test is successful, the upper half of the initial clock speed range is used as the possible speed range for further tests. On the other hand, if the first test is not successful, the lower half of the initial clock speed range is used as the possible speed range for further tests. In each successive test the midpoint of the possible speed range is tested in order to determine whether to continue testing above or below that midpoint. Such a binary test sequence tends to converge on the actual maximum speed of the device under test more rapidly than the linear test sequence described in the preceding paragraph.

Figure 2:
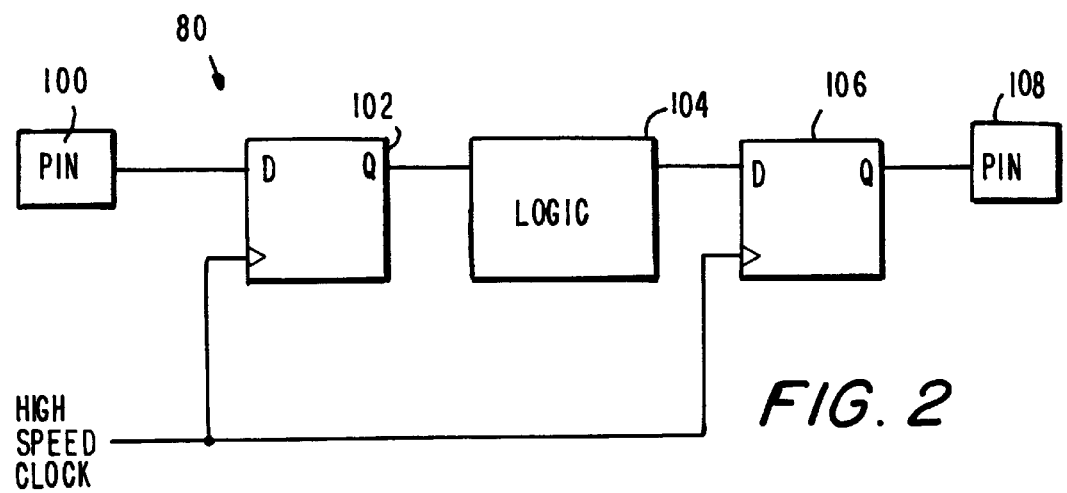
FIG. 2 is a simplified block diagram showing an illustrative configuration of a device to be tested in order to perform certain kinds of tests in accordance with the invention.

FIG. 2 illustrates another way in which high speed clock 42 can be used to test a speed parameter of a device 80. In this case the speed parameter is the so-called register to register delay of the device. Again it is assumed that device 80 is a reprogrammable logic array integrated circuit device. Test data sets up device 80 so that it includes the configuration shown in FIG. 2. This configuration includes a data input pin 100 of device 80 connected to the data input terminal of a first flip-flop register 102. The Q output of register 102 is applied to an input of any logic 104, the speed of which it is desired to test. The output of logic 104 is applied to the data input of a second flip-flop register 106. The Q output of register 106 is applied to data output pin 108 of device 80. Registers 102 and 106 are both clocked by the high speed clock signal from clock 42.

Test data selects a speed for clock 42 and causes a predetermined logic level to be applied to pin 100. Clock 42 is then operated for two pulses at the selected speed. The first clock pulse causes register 102 to apply the signal on pin 100 to logic 104. Logic 104 operates on the signal from register 102 and applies a resulting logic signal to the D input of register 106. The second clock pulse causes register 106 to latch in the output of logic 104 and apply that output to pin 108. Device 80 is thereafter strobed for the state of pin 108. If the speed of clock 42 is too high, logic 104 will not have produced its output in time to be latched into register 106. The test can then be repeated with slower clock speeds. Again, successive clock speeds can be selected according to the above-described binary test sequence if desired. The fastest clock speed for which data is successfully latched into flip-flop 106 gives the register to register delay (i.e., flip-flop 102 to flip-flop 106 delay) of device 80.

The foregoing demonstrates that even though most of the channels of the testers of this invention are of relatively low cost (because they are without high speed, precision, signal timing control), the one channel that includes high speed clock 42 gives these testers considerable capability with regard to testing device speed and timing characteristics.

Another feature that the testers of this invention may include is a form of direct memory access (DMA) of test vector data by controller board 40. If provided, this feature may be used as an alternative to having the processor 22 of computer 20 access test vector data from memory 24. In the direct memory access mode board 40 retrieves test vector data from memory 24 via PCI bus 28 without processor 22 being involved. Board 40 can retrieve test vector data several times faster than processor 22 can. In DMA mode board 40 takes some data from memory 24 and uses that data as address data for subsequent test vector data to be retrieved by board 40. Because this retrieval does not involve processor 22, it can take place several times faster than if processor 22 were involved. This can speed up the testing of devices 80.

It is preferred to use reprogrammable PLDs 52 on pin channel board 50 because such PLDs are reprogrammable to radically change what the tester does. For example, the tester architecture can be changed to test different types of devices (e.g., PLDs, RAMs, etc.) As another example, the pin-outs from board 50 are remappable to simplify cabling to test head 70. Moreover, PLDs 52 can be programmed to themselves generate a sequence of test signals to be applied to device 80, thereby avoiding the need for separate test vectors from memory 24 for each and every test condition. For example, PLDs 52 can be programmed as counters to automatically test sequential memory locations in a memory device 80. Or PLDs 52 can be programmed as a sequential pattern generator to automatically apply a desired sequence of test signals to device 80. In addition to reducing the amount of test vector data that must be stored in and retrieved from memory 24, this technique can greatly speed up device testing because free-running PLDs 52 can produce successive test states more rapidly than such states can be sent down from elements 20 and 40.

The testers of this invention lend themselves to construction on boards that can be plugged into a standard personal computer. For example, each of boards 40, 50, 60, and 64 may be a board that can be plugged into the back-plane of computer 20. This facilitates the provision of very powerful, but nevertheless compact and inexpensive, "desk-top" testers.

Figure 3:
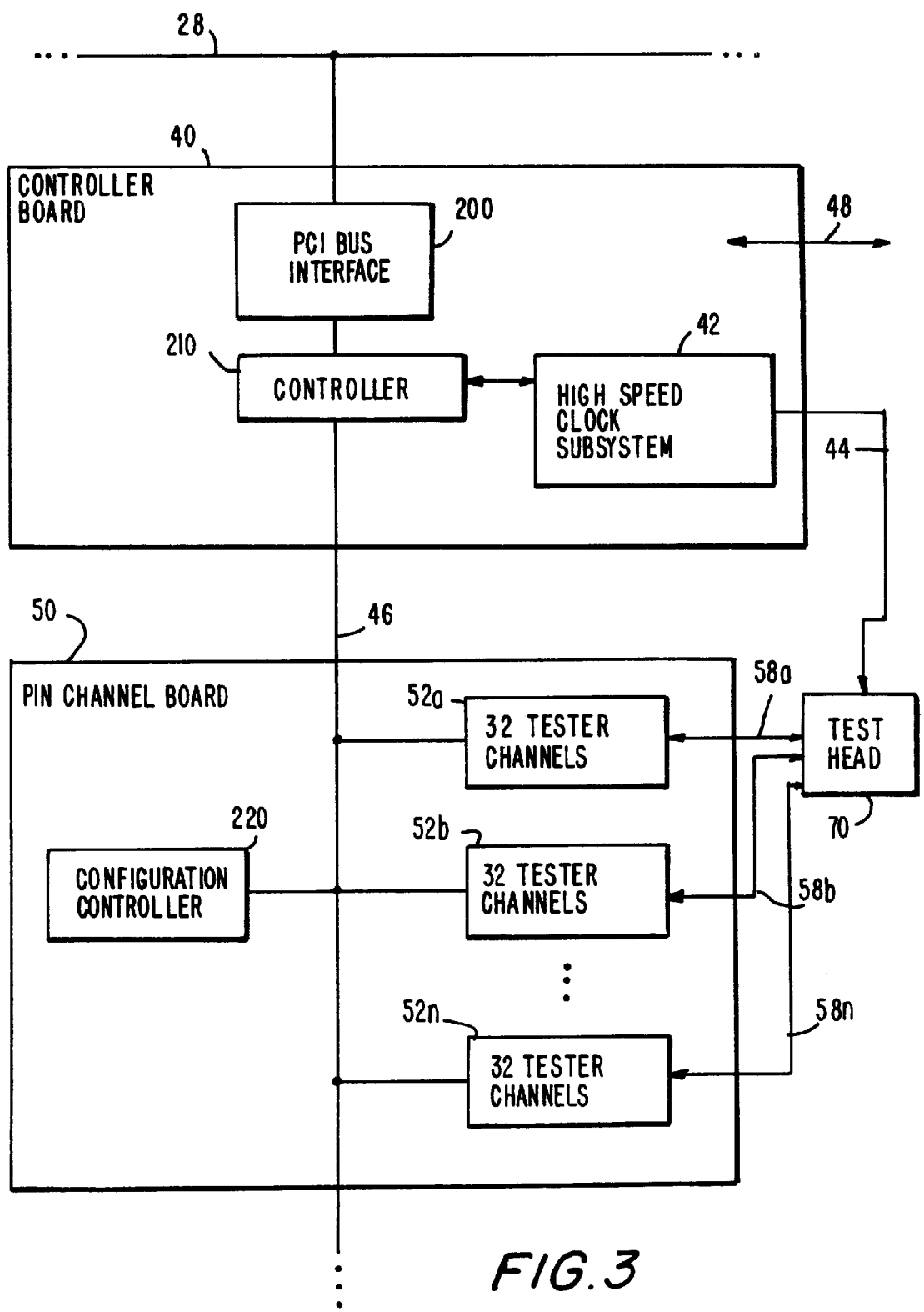
FIG. 3 is a simplified block diagram of portions of FIG. 1 in more detail.

FIG. 3 shows portions of the illustrative apparatus shown in FIG. 1 in more detail. PCI bus interface 200 provides the interface with the system PCI bus 28. Device 200 may be configured by the Bios of computer 20 to dynamically map two sections of the computer 20 address space as memory within the tester. Device 200 also supports the DMA transfer from main computer memory 24 of test vectors to the tester. An EEPROM holds configuration information for device 200. As has been mentioned, there is one controller board 40 per test system. It provides the connection point for use of the parametric measurement unit (PMU) (connected to board 40 via leads 48 as described above in connection with FIG. 1). The PMU signals are then carried via bus 46 to each pin channel board 50.

Controller 210 (which may be built from a device such as an Altera FLEX 10K reprogrammable logic device) provides all of the control and sequencing functions of the tester. Dedicated control lines interface to high speed clock subsystem 42. All the tester channel functions of the tester are connected via bus 46, which originates from controller 210. An EPROM is used to configure controller 210.

High speed clock subsystem 42 (already extensively described above) provides for generating a burst of up to $2^{39}$ pulse at a programmable frequency ranging up to 200 MHz. The output driver of subsystem 42 has programmable drive levels ranging between 0 volts and +5 volts.

Configuration controller 220 (which may be built from reprogrammable logic devices) connects to bus 46 and is used to provide low level signals for configuring each of tester channel devices 52 on the associated pin channel board 50. Controller 220 also provides the control signal for a PMU relay on each board 50. Controller 220 also sets the digital to analog converter values for the pin channel drive level supplies on the associated board 50. The pin channel drive level is the voltage represented by a logic 1 in a test vector. There is a pin channel drive level power supply for each group of 64 tester channels.

Tester channel devices 52 (which, as mentioned above, may be Altera FLEX 10K reprogrammable logic devices) provide 32 tester channels each. Devices 52 connect directly to bus 46 for receiving test commands and passing back information. Devices 52 are configured from disk memory of computer 20 under program control via the associated configuration controller 220. Each pin channel board 50 includes a configuration controller 220 and four devices 52 which collectively drive 128 pins of device 80 via test head 70. The tester architecture may provide for any number of such 128-channel boards 50.

Figure 4:
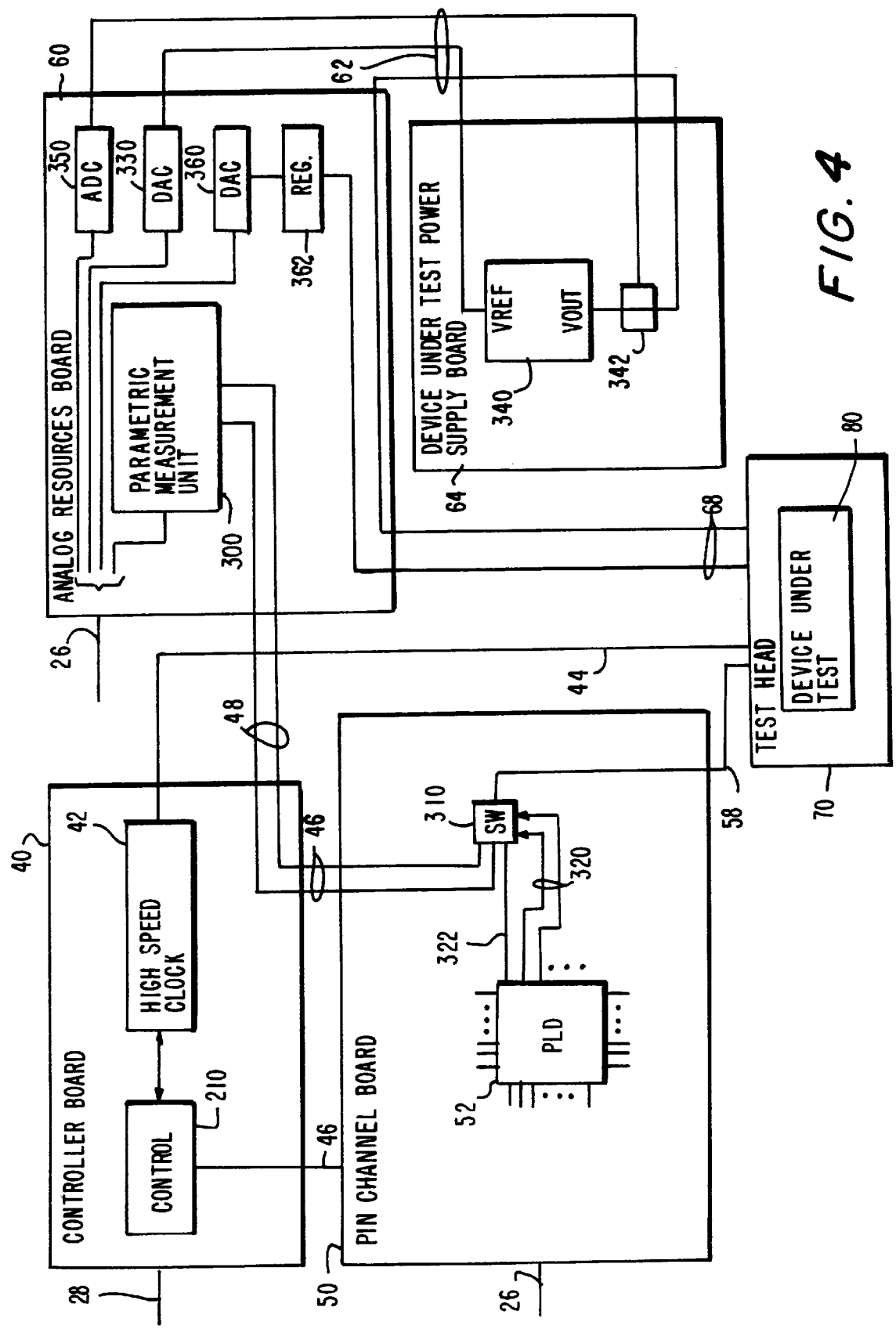
FIG. 4 is a simplified block diagram of other portions of FIG. 1 in more detail.

FIG. 4 shows other portions of FIG. 1 in more detail. For example, FIG. 4 shows a parametric measurement unit 300 on analog resources board 60. Parametric measurement unit 300 is controllable via ISA bus 300 to force a particular voltage onto one of leads 48 for application to a pin of device 80 via a lead 46, a switch 310, and a lead 58. PLD 52 controls switch 310 via leads 320 to connect the appropriate lead 46 to lead 58. Alternatively, parametric measurement unit 300 is controllable via ISA bus 300 to sense the voltage on a particular one of device 80 pins via another one of leads 48 and the corresponding lead 46, switch 310, and lead 58. Again, PLD 52 controls switch 310 via leads 320 to connect the appropriate lead 46 to lead 58. If instead of a parametric test of the above-mentioned device 80 pin, it is desired to perform a logic test using that pin, pin channel logic I/O 322 of PLD 52 is used. In addition, PLD 52 controls switch 310 via leads 320 to connect logic I/O 322 to lead 58.

Analog resources board 60 includes a digital-to-analog converter 330 for receiving a digital power supply (VCC) voltage request and for producing a corresponding analog reference voltage on an associated one of leads 62. This reference voltage is applied to the control input terminal of variable voltage supply 340 on power supply board 64. Supply 340 produces the requested VCC output voltage, which is applied via another one of leads 62 and one of leads 68 to a power supply (VCC) pin of device 80. Current sensor 342 may sense the amount of current flowing in the output lead of supply 340 and apply a corresponding analog signal to analog-to-digital converter 350 via still another one of leads 62. Analog-to-digital converter 350 produces a corresponding digital output for return to computer 20 (FIG. 1) via ISA bus 26.

Analog resources board 60 may include another digital-to-analog converter 360 for receiving a digital programming voltage (VHH) request and for producing a corresponding analog output signal which is applied to regulator 362. The output signal of regulator 362 is applied to the VHH pin of a device 80 that is based on EPROM technology or other similar technologies that require an elevated voltage for programming.

Assuming that each PLD 52 can control 32 pins of device 80, then connections of the type shown on the right-hand side of representative PLD 52 in FIG. 4 are repeated 32 times. A switch 310 is provided for each such repetition of the above-mentioned connections. Other connections to each PLD 52 include (1) a 32-bit bus for control and test vector data, (2) a chip select input, (3) a read input, (4) a write input, (5) the PCI clock signal, (6) signals from controller board 40 associated with the high speed clock 42, and (7) function select signals from controller board 40 which result from decoding of address bus signals by controller board 40. Examples of functions selected by the last-mentioned signals are (a) write pin-channel drive data and read device under test pin-channel data, (b) write pin-channel I/O state, (c) turn on pin-channel switch, and (d) turn on parametric unit switch. The pin channel referred to in the preceding sentence may be representative lead 322 in FIG. 4. The pin channel switch and parametric unit switch may be various "positions" of representative switch 310 in FIG. 4.

Figure 5:
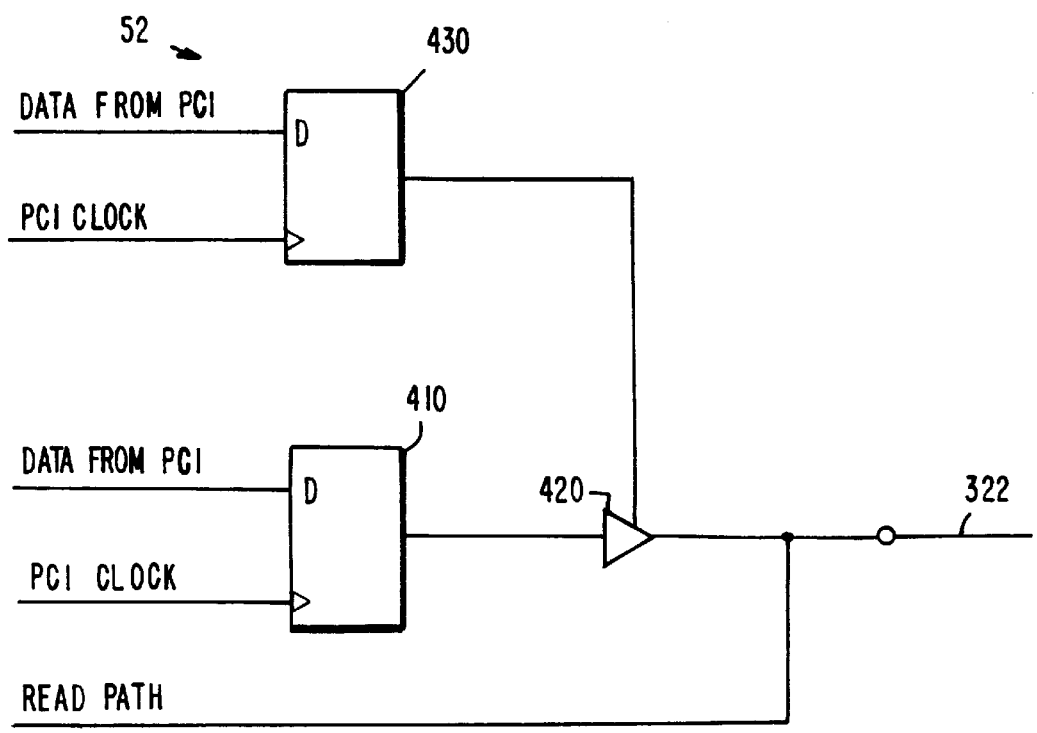
FIG. 5 is a simplified schematic block diagram of a portion of FIG. 4 in still more detail.

In connection with the immediately preceding paragraph, FIG. 5 shows the I/O portion of a typical pin channel on a representative PLD 52. Data to be driven onto representative pin channel 322 is applied to the D input of PLD 52 register 410. Register 410 is clocked by the PCI clock signal. The output signal of register 410 is applied to the data input terminal of PLD 52 tri-state output driver 420. Data for controlling the state of tri-state driver 420 is applied to the data input terminal of PLD 52 register 430. Register 430 is also clocked by the PCI clock signal. Read path 440 on PLD 52 is used to bring data from the device under test 80 via pin channel 322 into PLD 52. The above-mentioned function select signals for selecting the function "write pin-channel drive data and read device under test pin-channel data" is associated, for example, with controlling register 430 to enable tri-state driver 420 to pass data from register 410 to pin channel 322.

It will be understood that the foregoing is only illustrative of the principles of the invention, and that various modifications can be made by those skilled in the art without departing from the scope and spirit of the invention. For example, any number of pin channel boards 50 can be provided in order to permit testing of devices 80 with any number of terminals.

What is claimed is:

1. A tester configured to test an electronic circuit under test comprising:
   a high speed clock channel configured to selectively output a high speed clock signal for application to said electronic circuit under test;
   a plurality of data channels configured to selectively convey data signals to and from said electronic circuit under test;
   a low speed clock signal circuit configured to control the timing of operations of said data channels; wherein said high speed clock signal is of a higher speed and is more precise relative to said low speed clock signal;
   analog circuitry configured to selectively generate and apply parametric test signals to said circuit under test; and
   programmable interconnection circuitry coupled to a plurality of leads on said circuit under test that allow at least one data signal and at least one parametric signal to be simultaneously applied to different leads on said circuit under test.

2. The tester defined in claim 1 further comprising:
   a computer, wherein said low speed clock signal circuit is part of said computer which at least partly controls said tester, said low speed clock signal circuit controlling at least some operations of said computer.

3. The tester defined in claim 2 wherein said low speed clock signal circuit is the clock circuit of an interface bus of said computer.

4. The tester defined in claim 2 wherein said interface bus is a peripheral component interface (PCI) bus.

5. The tester defined in claim 1 further comprising control circuitry configured to sequentially (1) cause one of said data channels to output a data signal for application to said electronic circuit under test, (2) operate said high speed clock channel, and (3) cause one of said data channels to input a data signal from said electronic circuit under test.

6. The tester defined in claim 5 wherein said control circuitry is controlled by said low speed clock signal circuit with respect to the timing of said events (1), (2), and (3).

7. The tester defined in claim 1 wherein said high speed clock channel is programmable with respect to the speed of said high speed clock signal.

8. The tester defined in claim 1 wherein said high speed clock channel is programmable with respect to the duration of said high speed clock signal.

9. The tester defined in claim 1 wherein said high speed clock channel is programmable with respect to the number of cycles of said high speed clock signal.

10. The tester defined in claim 1 wherein said low speed clock signal circuit has a fixed frequency of operation.

11. The tester defined in claim 1 wherein said data signals are logic-type signals.

12. The tester defined in claim 1 wherein said parametric signals comprise
    an analog signal having any one of a plurality of different analog signal characteristic values for application to said electronic circuit under test via one of said channels.

13. The tester defined in claim 12 wherein said analog signal characteristic is voltage.

14. The tester defined in claim 13 wherein said analog circuitry includes analog measurement circuitry configured to measure the current of said analog signal when said analog signal is applied to said electronic circuit under test.

15. The tester defined in claim 12 wherein said analog signal characteristic is current.

16. The tester defined in claim 15 wherein said analog circuitry includes analog measurement circuitry configured to measure the voltage of said analog signal when said analog signal is applied to said electronic circuit under test.

17. The tester defined in claim 1 further comprising:
a programmable computer configured to at least partly control said channels.

18. The tester defined in claim 17 wherein said computer is of the personal computer class.

19. The tester defined in claim 17 wherein said channels are part of interface circuitry between said computer and said electronic circuit under test.

20. The tester defined in claim 19 wherein said interface circuitry is programmable by said computer.

21. The tester defined in claim 20 wherein said interface circuitry comprises programmable logic devices.

22. The tester defined in claim 20 wherein said interface circuitry includes signal sequence generating circuitry configured to generate a succession of data signals which said data channels apply to said electronic circuit under test.

23. The tester defined in claim 22 wherein said low speed clock signal circuit is part of said computer, and wherein said signal sequence generating circuitry is responsive to said low speed clock signal circuit so that said succession of data signals has a frequency related to the frequency of said low speed clock signal circuit.

24. The tester defined in claim 23 wherein said low speed clock signal circuit is an interface bus clock circuit of said computer.

25. The tester defined in claim 24 wherein said interface bus clock circuit is a PCI bus clock circuit.

26. The tester defined in claim 19 further comprising a memory for data indicative of corresponding data signals that are to be conveyed to said electronic circuit under test via said data channels, and wherein said interface circuitry includes bus master circuitry configured to selectively control retrieval of said data from said memory in order to cause said data channels to apply said corresponding data signals to said electronic circuit under test.

27. The tester defined in claim 19 wherein said interface circuitry includes comparison circuitry configured to compare data signals conveyed from said electronic circuit under test via said data channels to data signals expected from said electronic circuit under test in response to data signals conveyed to said electronic circuit under test via said data channels.

28. The tester defined in claim 27 wherein said comparison circuitry includes latch circuitry configured to store a test result signal produced by said comparison circuitry to indicate whether or not data signals conveyed from said electronic circuit under test are the same as data signals expected from said electronic circuit under test.

29. The tester defined in claim 28 wherein said latch circuitry is addressable by said computer to allow said computer to read said test result signal.

30. The tester defined in claim 17 further comprising a memory for data indicative of corresponding data signals that are to be conveyed to said electronic circuit under test via said data channels, and wherein said computer includes a processor configured to selectively control retrieval of said data from said memory in order to cause said data channels to apply said corresponding data signals to said electronic circuit under test.

31. Apparatus configured to test an electronic circuit under test which has a plurality of electrical signal terminals comprising:
a programmable computer including a memory and an interface bus configured to transmit signals at a predetermined bus clock rate, said memory storing test vector data indicative of input signals to be applied to terminals of said electronic circuit under test and output signals expected from said electronic circuit under test in response to said input signals, said test vector data including data indicative of a number of bus clock cycles to allow between application of said input signals and testing for said output signals;
interface circuitry connected to said bus and coupled between said computer and said electronic circuit under test and configured to receive said test vector data and respond to said test vector data by applying to terminals of said electronic circuit under test the input signals indicated by said test vector data and by testing for output signals of said electronic circuit under test indicated by said test vector data when said number of bus clock cycles have elapsed after application of said input signals; and
analog circuitry coupled to said interface circuitry configured to selectively generate analog signals having any one of a plurality of different analog signal characteristic values; said interface circuitry optionally using said analog signals as an input applied to at least one terminal of said electronic circuit under test while simultaneously using said test vector data as input to at least one different terminal of said electronic circuit under test.

32. The apparatus defined in claim 31 wherein said bus transmits a cyclical bus clock signal having periodic signal level transitions at said bus clock rate, and wherein said interface circuitry is responsive to said bus clock signal by applying said input signals to terminals of said electronic circuit under test in synchronism with a first transition in said bus clock signal and for testing for said output signals of said electronic circuit under test in synchronism with a second transition in said bus clock signal, said second transition being separated from said first transition by said number of bus clock cycles.

33. The apparatus defined in claim 31 wherein said electronic circuit under test includes a clock signal input terminal, and wherein said interface circuitry includes a high speed clock signal generating circuit configured to selectively generate a high speed clock signal that is applied to said clock signal input terminal, said high speed clock signal having a frequency that is higher than said bus clock rate.

34. The apparatus defined in claim 33 wherein said high speed clock signal generating circuit is programmable to generate said high speed clock signal with any one of a plurality of different frequencies.

35. The apparatus defined in claim 34 wherein said plurality of different frequencies are independent of said bus clock rate.

36. The apparatus defined in claim 33 wherein said high speed clock signal generating circuit is programmable to generate any one of a plurality of different numbers of cycles of said high speed clock signal.

37. The apparatus defined in claim 31 wherein said electronic circuit under test includes logic circuitry, at least some of said terminals being terminals of said logic circuitry, and wherein said input signals applied to terminals of said logic circuitry by said interface circuitry are logic-type input signals.

38. The apparatus defined in claim 37 wherein said interface circuitry tests output signals of terminals of said logic circuitry as logic-type output signals.

39. The apparatus defined in claim 31 wherein said analog signal characteristic is voltage.

40. The apparatus defined in claim 39 wherein said analog circuitry includes analog measurement circuitry configured to measure the current of said analog signal when said analog signal is used as an input signal applied to a terminal of said electronic circuit under test.

41. The apparatus defined in claim 31 wherein said analog signal characteristic is current.

42. The apparatus defined in claim 41 wherein said analog circuitry includes analog measurement circuitry configured to measure the voltage of said analog signal when said analog signal is used as an input signal applied to a terminal of said electronic circuit under test.

43. The apparatus defined in claim 31 wherein said interface circuitry includes a programmable logic device which is programmable by said computer to associate any one of a plurality of physical locations in said interface circuitry with each of said terminals of said electronic circuit under test, each of said physical locations being a source of one of said input signals or a receiver of one of said output signals.

44. The apparatus defined in claim 31 wherein said interface circuitry includes signal sequence generating circuitry configured to respond to certain test vector data and said bus clock signals by producing a succession of said input signals synchronized with said bus clock signal without the need for additional test vector data during said succession.

45. The apparatus defined in claim 31 wherein said interface circuitry includes a programmable logic device which is programmable by said computer with respect to the manner in which said interface circuitry responds to test vector data.

46. The apparatus defined in claim 45 wherein said programmable logic device is reprogrammable by said computer.

47. The apparatus defined in claim 31 wherein said computer additionally includes a processor configured to selectively control retrieval of said test vector data from said memory and transmission of retrieved test vector data to said interface circuitry via said bus.

48. The apparatus defined in claim 47 wherein said interface circuitry includes bus master circuitry configured to selectively use said bus to directly access said memory for said test vector data without using said processor for such memory access.

49. The apparatus defined in claim 31 wherein said interface circuit includes comparison circuitry configured to compare output signals of said electronic circuit under test indicated by said test vector data to said output signals expected from said electronic circuit under test in response to said input signals.

50. The apparatus defined in claim 49 wherein said comparison circuitry includes latch circuitry configured to store a test result signal produced by said comparison circuitry to indicate whether or not said output signals of said electronic circuit under test indicated by said test vector data are the same as said output signals expected from said electronic circuit under test in response to said input signals.

51. The apparatus defined in claim 50 wherein said latch circuitry is addressable by said computer to allow said computer to read said test result signal.

52. The apparatus defined in claim 31 wherein said computer is of the personal computer class.

53. The tester defined in claim 31 wherein said interface bus is a peripheral component interface (PCI) bus.

54. The method of testing the operating speed of a circuit under test using a circuit tester which has a high speed clock channel configured to output a high speed a clock signal, and a plurality of data channels configured to convey data signals, said high speed clock signal being of higher speed and greater timing precision relative to said data signals, said circuit under test having an input terminal, an output terminal, and intermediate circuitry connected to said input terminal and configured to produce at said output terminal an output data signal that is dependent on response of said intermediate circuitry to the signal received via said input terminal, said method comprising:
  connecting said high speed clock channel to said input terminal;
  connecting a data channel to said output terminal;
  operating said high speed clock channel to output said high speed clock signal to a predetermined extent, after which said high speed clock signal is stopped;
  after said high speed clock signal has stopped, using said data channel that is connected to said output terminal to read out said output data signal;
  comparing said data output signal that is read out via said data channel to a value that is associated with proper operation of said digital circuit under test; and
  if said data output signal that is read out via said data channel compares favorably to said value, repeating said operating, using, and comparing with increased high speed clock signal speed.

55. The method defined in claim 54 wherein said repeating is performed with increased high speed clock signal speeds until said data output signal that is read out via said data channel no longer compares favorably to said value.

56. The method defined in claim 54 further comprising:
  if said data output signal that is read out via said data channel does not compare favorably to said value, repeating said operating, using, and comparing with decreased high speed clock signal speed.

57. The method defined in claim 56 wherein said repeating is performed with decreased high speed clock signal speeds until said data output signal that is read out via said data channel compares favorably to said values.

58. The method defined in claim 54 wherein said operating and using are repeated using successive high speed clock signal speeds that are selected according to a binary test sequence.

59. The method defined in claim 54 wherein said digital circuit under test has a maximum possible speed which is to be determined but which is known to be in a range between a lower limit and an upper limit, and wherein in said operating said high speed clock channel is operated to produce said high speed clock signal at a first speed which is intermediate said lower and upper limits.

60. The method defined in claim 59 further comprising:
  selecting a new speed for said high speed clock signal which is intermediate said first speed and said upper limit if said output data signal compares favorably to a value that is associated with proper operation of said digital circuit under test;
  selecting a new speed for said high speed clock signal which is intermediate said first speed and said lower limit if said output data signal does not compare favorably to a value that is associated with proper operation of said digital circuit under test; and repeating said operating with said high speed clock signal at said new speed.

61. The method defined in claim 60 wherein said first speed is midway between said lower and upper limits, and wherein said new speed is midway between said first speed and one of said lower and upper limits.

62. The method defined in claim 59 wherein said first speed is midway between said lower and upper limits.

63. The method defined in claim 54 wherein said intermediate circuitry includes a counter; said method being characterized by configuring said counter to count pulses in the signal received via said input terminal wherein said data output signal is indicative of the count registered by said counter.

64. The method defined in claim 54 wherein said digital circuit under test also has a second input terminal configured to receive a data input signal, wherein said intermediate circuitry is also connected to said second input terminal, wherein said data output signal is also dependent on said data input signal, and wherein said method further comprises:

connecting a data channel to said second input terminal; and prior to operating said high speed clock channel, employing said data channel that is connected to said second input terminal to apply said data input signal to said second input terminal.

65. The method defined in claim 64 wherein said intermediate circuitry includes first and second registers and medial circuitry, said first register having an input lead connected to said second input terminal, a clock lead connected to said input terminal, and an output lead connected to said output terminal, each of said registers storing and outputting the signal applied to its input lead in response to a high speed clock signal applied to its clock lead, and said medial circuitry producing at its output a signal indicative of the signal applied to its input, and wherein said method further comprises:

comparing said data output signal that is read out via said data channel to a value that is associated with proper operation of said medial circuitry in response to said data input signal.

66. The method defined in claim 65 further comprising:

if said data output signal that is read out via said data channel compares favorably to said value, repeating and operating, using, employing, and comparing with increased high speed clock signal speed.

67. The method defined in claim 66 wherein said repeating is performed with increased high speed clock speeds until said data output signal that is read out via said data channel no longer compares favorably to said value.

68. The method defined in claim 65 further comprising:

if said data output signal that is read out via said data channel does not compare favorably to said value, repeating said operating, using, employing, and comparing with decreased high speed clock signal speed.

69. The method defined in claim 68 wherein said repeating is performed with decreased high speed clock signal speeds until said data output signal that is read out via said data channel compares favorably to said value.

* * * * *